(12) United States Patent
Hayakawa

(10) Patent No.: US 7,394,640 B2
(45) Date of Patent: Jul. 1, 2008

(54) ELECTROSTATIC CHUCK AND SUBSTRATE FIXING METHOD USING THE SAME

(75) Inventor: Hirofumi Hayakawa, Tokyo (JP)

(73) Assignee: Advantest Corp., Tokyo (JP)

( * ) Notice: Subject to any disclaimer, the term of this patent is extended or adjusted under 35 U.S.C. 154(b) by 291 days.

(21) Appl. No.: 11/089,375

(22) Filed: Mar. 23, 2005

(65) Prior Publication Data
US 2005/0213279 A1    Sep. 29, 2005

(30) Foreign Application Priority Data
Mar. 26, 2004    (JP)    ............................. 2004-093184

(51) Int. Cl.
*H02N 13/00*    (2006.01)
(52) U.S. Cl. ..................... 361/234; 279/128
(58) Field of Classification Search ................ 361/234; 279/128
See application file for complete search history.

(56) References Cited

U.S. PATENT DOCUMENTS

| | | | | |
|---|---|---|---|---|
| 4,692,836 A | * | 9/1987 | Suzuki ..................... 361/234 |
| 5,221,450 A | * | 6/1993 | Hattori et al. ........... 204/192.32 |
| 5,400,209 A | * | 3/1995 | Moslehi ..................... 361/234 |
| 5,469,489 A | * | 11/1995 | Miyake et al. ............... 378/35 |
| 5,474,614 A | * | 12/1995 | Robbins ..................... 118/728 |
| 5,535,090 A | * | 7/1996 | Sherman ..................... 361/234 |
| 5,572,398 A | * | 11/1996 | Federlin et al. ............ 361/234 |
| 5,751,538 A | * | 5/1998 | Nakasuji ..................... 361/234 |
| 5,847,813 A | | 12/1998 | Hirayanagi |
| 5,946,184 A | * | 8/1999 | Kanno et al. ................ 361/234 |
| 6,433,346 B1 | | 8/2002 | Hirayanagi |
| 6,487,063 B1 | * | 11/2002 | Nakasuji ..................... 361/234 |
| 2003/0067734 A1 | * | 4/2003 | Nakano ..................... 361/234 |
| 2003/0178468 A1 | * | 9/2003 | Lee et al. ..................... 228/102 |

FOREIGN PATENT DOCUMENTS

| | | | |
|---|---|---|---|
| JP | 63299137 A | * | 12/1988 |
| JP | 10-50584 | | 2/1998 |
| JP | 2001-77184 | | 3/2001 |
| JP | 2001-118776 | | 4/2001 |

* cited by examiner

*Primary Examiner*—Michael J Sherry
*Assistant Examiner*—Ann T Hoang
(74) *Attorney, Agent, or Firm*—Murmatsu & Associates

(57) ABSTRACT

The electrostatic chuck 101 where pairs of electrodes 3a/3b, 4a/4b and 5a/5b to which voltages are applied are embedded in the main body 1, and where a substrate 110 is placed and held on the surface of the main body 1, includes a first electrode group constituted of one pair or more of electrodes 3a/3b arranged in a center region 41 inside the main body 1, and a second electrode group constituted of one pair or more of electrodes 4a/4b and 5a/5b arranged in outer peripheral portions 42 and 43 surrounding the center region 41.

10 Claims, 9 Drawing Sheets

ELECTROSTATIC CHUCK AND SUBSTRATE FIXING METHOD USING THE SAME

CROSS-REFERENCE TO RELATED APPLICATION

This application is based on and claims priority of Japanese Patent Application No. 2004-093184 filed on Mar. 26, 2004, the entire contents of which are incorporated herein by reference.

BACKGROUND OF THE INVENTION

1. Field of the Invention

The present invention relates to an electrostatic chuck and a substrate fixing method using the same. More specifically, the present invention relates to an electrostatic chuck which holds, and fixes, a substrate subject to a treatment in a vacuum processing apparatus such as a charged particle beam exposure apparatus, and to a substrate fixing method using the electrostatic chuck.

2. Description of the Prior Art

With regard to a low pressure processing apparatus, such as a deposition apparatus by use of low pressure CVD and sputtering, an etching apparatus and an electron beam exposure apparatus, which performs a process under a low pressure, electrostatic chucks have been used as means for holding a substrate to be processed in many cases.

An electrostatic chuck to be used in a deposition apparatus has been disclosed in Japanese Patent Laid-open Official Gazette No. Tokkai 2001-77184 (hereinafter referred to as "Patent Literature 1"). FIG. 1 of Patent Literature 1 shows the inside of the main body 21 of the electrostatic chuck 20. A positive electrode 23 is provided in the entire surface of the left half plane, and a negative electrode 24 is provided in the entire surface of the right half plane. A substrate 111 with a uniform thickness on which an insulating film and the like are going to be formed is placed and held on the electrostatic chuck 20, as shown in FIG. 6 of Patent Literature 1.

Incidentally, Japanese Patent Laid-open Official Gazette No. Tokkai 2001-118776 (hereinafter referred to as "Patent Literature 2") and Japanese Patent Laid-open Official Gazette No. Tokkai Hei. 10-50584 (hereinafter referred to as "Patent Literature 3") have respectively disclosed electrostatic chucks which are used in charged particle beam exposure apparatus, although neither of these electrostatic chucks hold a substrate which was going to be processed. Each of these electrostatic chucks holds a mask substrate, which has a partially thicker portion and a partially thinner portion, and whose thinner portion has already been patterned. The electrostatic chuck according to Patent Literature 2 opens in its center portion corresponding to the thinner portion 107 of the mask substrate 101 which has been placed, and arc-shaped electrodes 103 and 103' or half ring-shaped electrodes 503 and 503' are embedded in a belt-shaped peripheral portion corresponding to the thicker portion of the mask substrate 101, as shown in FIGS. 1 and 5 of Patent Literature 2. The electrostatic chuck according to Patent Literature 3 opens in its portion corresponding to the thinner portion 1b of the mask 1 which has been placed, and electrodes 4a are embedded in grid shape in its portions 2a and 2c corresponding to a thicker beam 1a and a frame 1c of the mask 1.

In general, a low pressure processing apparatus including the electrostatic chuck according to Patent Literature 1 can process not only a substrate with a uniform thickness, but also a mask substrate (a membrane mask substrate) which have a partially thicker portion and a partially thinner portion, while operating as a single apparatus.

For example, in a case where a membrane mask substrate is fabricated by use of an electron beam exposure apparatus including an electrostatic chuck which is similar to that disclosed in Patent Literature 1, a resist film is formed in a plane surface of a substrate which has a partially thicker portion and a partially thinner portion. The substrate is placed on the electrostatic chuck in a way that the back surface of the substrate, on which the resist film has not been formed, and which is the back surface of the thicker portion of the substrate, is brought into contact with the substrate placement surface of the electrostatic chuck. Then, voltage is applied to the electrodes in order to electrostatically adsorb, and fix, the substrate to the substrate placement surface of the electrostatic chuck. Subsequently, a resist film on a portion where the thickness of the substrate is thinner is exposed to light, and the resist film is developed. Accordingly, a resist pattern is formed in the substrate. Thereafter, the substrate is transferred from the exposure apparatus to an etching apparatus in a low pressure atmosphere by use of transfer means such as a robot. An opening is formed in the portion where the thickness of the substrate is thinner by using the resist pattern as a mask, and thereby a mask substrate is fabricated.

However, in a case where an electron beam exposure apparatus including the electrostatic chuck similar to that disclosed in Patent Literature 1 is applied to the membrane mask substrate, electrostatic attraction also acts in the portion where the thickness of the membrane mask substrate is thinner, since an electrode of the electrostatic chuck exists below the portion where the thickness of the membrane mask substrate is thinner. For this reason, it is likely that the portion where the thickness of the membrane mask substrate is thinner will deflect so that the flatness of the surface is deteriorated. Accordingly, it is likely that the precision in light exposure will be lowered.

For the purpose of avoiding the problems, there is a case that uses an electrostatic chuck similar to that disclosed in Patent Literature 2 including arc-shaped electrodes or half ring-shaped electrodes, which causes electrostatic adsorption force to act only on the portion where the thickness of the membrane mask substrate is thicker in order to fix the membrane mask substrate. In this case, however, it is likely that electrostatic adsorption force to the substrate with a uniform thickness will become insufficient, since an area where the membrane mask substrate is adsorbed to the substrate placement surface of the electrostatic chuck is small in spite of the relatively heavy weight of the substrate.

Alternatively, electrostatic chucks may be changed, when deemed adequately, depending on difference in shape of substrates, while those electrostatic chucks are used in the same single apparatus. However, the changing of the electrostatic chucks causes considerable inconvenience, thus lowering the throughput.

SUMMARY OF THE INVENTION

An object of the present invention is to provide an electrostatic chuck, and an substrate fixing method using the electrostatic chuck, which can hold substrates with various shapes, such as a substrate which has a partially thicker portion and a partially thinner portion as well as a substrate which has a uniform thickness, by use of sufficient electrostatic adsorption force, without lowering the throughput, and while maintaining the flatness of the surface.

The electrostatic chuck according to the present invention comprises a first electrode group which is configured of a pair or more of electrodes provided in a center region within the main body of the electrostatic chuck, and a second electrode group which is configured of a pair or more of electrodes arranged in an outer periphery of the center region.

In particular, the second electrode group is configured so that a pair or more of electrodes are arranged in an annular belt-shaped region surrounding the center region, or so that a pair or more of electrodes are arranged in each of a plurality of annular belt-shaped regions surrounding the center region. The center region is shaped, for example, like a circle or a quadrangle. In addition, each pair of a plurality of electrodes which constitute the first electrode group are arranged in the respective positions corresponding to each other with the center of the center region defined as a reference, and each pair of a plurality of electrodes which constitute the second electrode group are also arranged in the respective positions corresponding to each other with the center of the center region defined as a reference.

In this case, a direct current power supply and a ground are connected with each pair of electrodes in a way that any of the direct-current power supply and the ground can be selected.

A substrate (membrane substrate) which, for example, has a partially thinner portion in one of the center region and the peripheral region and a partially thicker portion in the other, is placed on the electrostatic chuck having the aforementioned configuration. In such a case, the voltage is applied selectively only to electrodes located in the portion where the membrane substrate is thicker as in a case of the substrate fixing method using the electrostatic chuck according to the present invention, and electrodes located in the portion where the membrane substrate is thinner is grounded, electrostatic adsorption force acts in the portion where the thickness of the membrane substrate is thicker so that the substrate is fixed. In addition, no electrostatic attraction is caused to act in the portion where the thickness of the membrane substrate is thinner so that the thinner portion does not deflect. This enables the flatness of the surface of the membrane substrate to be secured. For this reason, in a case where this electrostatic chuck is used, for example, in order to hold a membrane mask substrate with which to form an electron beam exposure mask, precision in exposure can be improved. On the other hand, when a substrate with a uniform thickness is placed, the voltage is applied to all the electrodes, electrostatic adsorption force acts on the entire substrate. Thus electrostatic adsorption force sufficient to hold the substrate can be obtained.

Furthermore, in a case where a direct current power supply is intended to be connected to each pair of electrodes, the direct current power supply is connected in a way that voltage of a different polarity is applied to a neighboring electrode. This enables uniformity in the surface of electrostatic adsorption force which acts in the substrate to be increased. Accordingly, the flatness of the surface can be improved.

In the aforementioned manner, a single electrostatic chuck can process substrates with various shapes while maintaining the flatness of the surface of the substrate, and while holding the substrate with sufficient electrostatic adsorption force. For this reason, electrostatic chucks do not have to be changed depending on difference in shape of substrates. Accordingly, the throughput can be improved.

Moreover, if the aforementioned electrostatic chuck is applied to transferring means, such as a robot, which needs to hold a substrate in a low pressure atmosphere, deformation could be prevented from occurring in the membrane substrate while the membrane substrate is being transferred. Furthermore, the substrate with a uniform thickness can be transferred while sufficient electrostatic adsorption force to the substrate being maintained.

BRIEF DESCRIPTION OF THE DRAWINGS

FIG. 2A is a cross-sectional view taken along the II-II line in FIG. 2B.

DESCRIPTION OF THE PREFERRED EMBODIMENT

Descriptions will be provided herein below for embodiments of the present invention with reference to the drawings.

First Embodiment

Figure 1A:
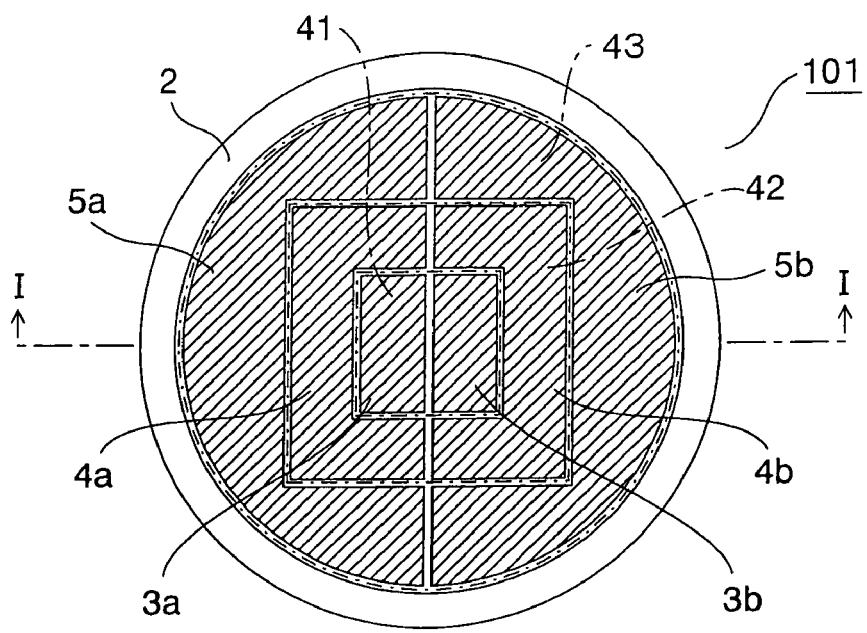
FIG. 1A is a top view showing an electrostatic chuck according to a first embodiment of the present invention.
Figure 1B:
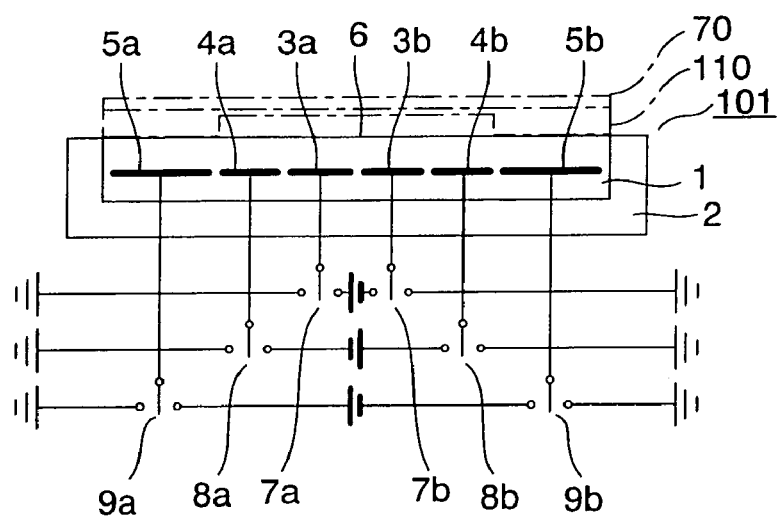
FIG. 1B is a cross-sectional view taken along the I-I line in FIG. 1A.
Figure 1C:
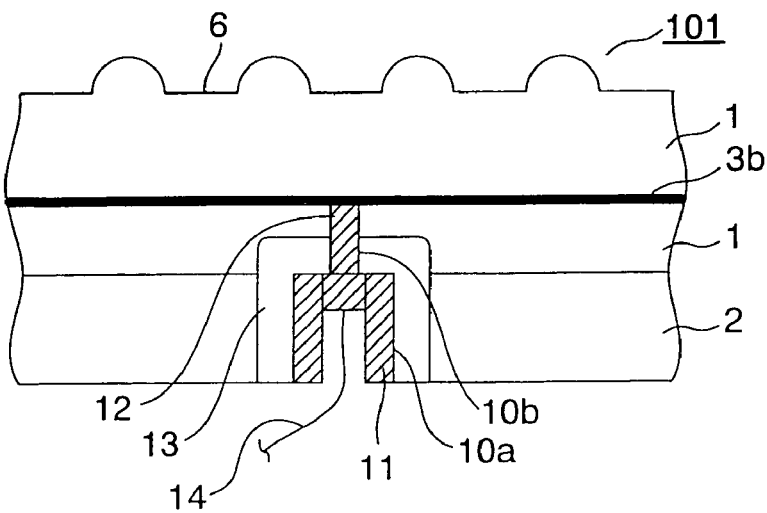
FIG. 1C is a partial, enlarged, cross-sectional view showing a structure of a part where a wire is drawn out from each electrode of the electrostatic chuck to the outside of the electrostatic chuck.

FIG. 1A is a plan view of an electrostatic chuck according to a first embodiment of the present invention. FIG. 1A shows an arrangement of, in particular, three pairs of electrodes. FIG. 1B is a cross-sectional view taken along the I-I line in FIG. 1A. FIG. 1B also shows how direct current power supplies are connected to the plurality of pairs of electrodes. FIG. 1C is a partial, enlarged, cross-sectional view showing a structure of a part where a wire is connected to each electrode of the electrostatic chuck toward the outside of the electrostatic chuck. Incidentally, in FIG. 1A, there are omissions of an illustration of an alumina member on the electrodes and an illustration of a substrate.

Figure 2A:
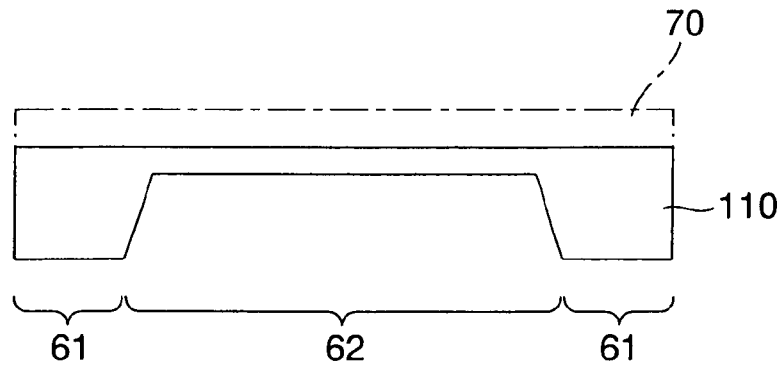
FIG. 2A is a cross-sectional view showing a membrane substrate which is placed, and held, on the electrostatic chuck according to the first embodiment of the present invention.
Figure 2B:
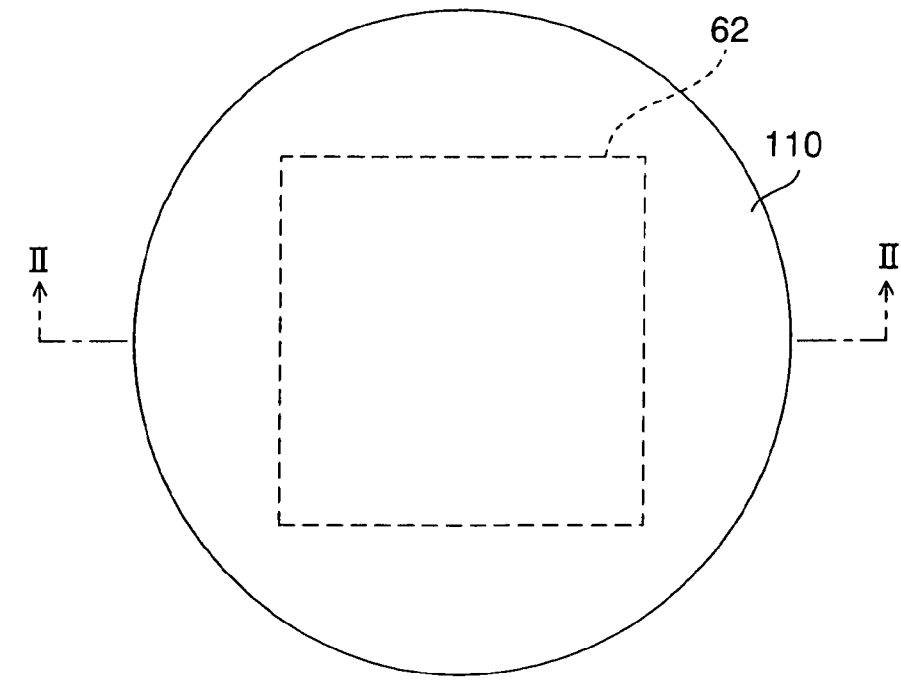
FIG. 2B is a top view of the membrane substrate.

FIGS. 2A and 2B are respectively diagrams showing a membrane mask substrate which is placed, and held, on the electrostatic chuck. FIGS. 2A and 2B are respectively a cross-sectional view, and a top view, showing the membrane mask substrate. FIG. 2A is a cross-sectional view taken along the II-II line in FIG. 2B.

Descriptions will be provided for the configuration of the electrostatic chuck according to the first embodiment of the present invention with reference to these drawings.

The electrostatic chuck 101 includes a disc-shaped main body 1 made of alumina, and a base 2 made of alumina, which covers the side surface and the lower surface of the main body 1. And the base 2 has a resistivity of $10^{13}$ Ωcm or higher, which is a higher resistivity than that of the main body 1. The three pairs of electrodes 3a/3b, 4a/4b and 5a/5b onto which voltage is applied are embedded into the inside of the main body 1. These electrodes 3a/3b, 4a/4b and 5a/5b are fabricated of a refractory metal which can withstand a temperature higher than a sintering temperature of alumina. The surface of the main body 1 above the electrodes 3a/3b, 4a/4b and 5a/5b serves as a substrate placement surface 6.

Various substrates 110 with different shapes can be placed, and held, on the substrate placement surface 6. In a case where, for example, a low pressure processing apparatus including the electrostatic chuck 101 is used as an electron beam exposure apparatus, one type of the substrates corresponds to a membrane substrate of which an exposure mask is formed, whose center portion is thinner than the peripheral portion so that an opening pattern is formed in the center portion. The other type of the substrates is a substrate for fabricating a semiconductor device, on which patterns such as an insulating film and a metallic film are formed, and which has the same thickness throughout the substrate. With any one of the two aforementioned types of substrates 110, a resist film 70 to be exposed is formed on the flat surface thereof before the substrate 110 is placed, and held, on the electrostatic chuck.

A substrate 110 indicated by a piece of chain line in FIG. 1B according to the present embodiment is a membrane substrate for fabricating the exposure mask, and whose center portion is thinner than its peripheral portion as shown in FIG. 2. The membrane substrate 110 is made of a silicon wafer with a diameter of approximately 200 mm. The thickness of the peripheral portion 61 of the membrane substrate 110 is approximately 725 μm, and the thickness of the center portion 62 thereof is several μm. The center portion 62 whose thickness is thinner than that of the peripheral portion 61 is shaped like a rectangle, measuring 120 mm×130 mm, or 40 mm×40 mm. Incidentally, the membrane substrate 110 can be used by changing the aforementioned measurements into various measurements.

Next, descriptions will be provided for arrangement of electrodes of the electrostatic chuck 101.

As shown in FIG. 1A, the electrodes 3a/3b, 4a/4b and 5a/5b are configured of a pair of electrodes 3a/3b (a first electrode group) which are arranged in a plane area in the center portion (center region) 41 inside the main body 1, and two pairs of electrodes 4a/4b and 5a/5b (a second electrode group), each pair of which is arranged respectively in the two annular belt-shaped regions 42 and 43, the two regions of which doubly surround the center region 41 while not crossing over with each other. The center region 41 is shaped like a quadrangle, and the dimensions of the center region 41 is approximately equal to that of the portion 62 in the membrane substrate 110 whose thickness is thinner. Corresponding to this, each of the two annular belt-shaped regions 42 and 43 is also shaped like an annular square. However, the outer edge of the outermost annular belt-shaped region 43 is shaped like a circle. In addition, all of the electrodes 3a/3b, 4a/4b and 5a/5b are arranged in a way that they do not contact one another.

The pair of electrodes 3a/3b which constitute the first electrode group are arranged in positions opposite to each other across the reference which is the center of the center region 41, i.e., at symmetrical positions to each other. Each of the two pairs of electrodes 4a/4b and 5a/5b which constitute the second electrode group is also arranged in positions opposite to each other across the reference which is the center of the center region 41 i.e., at positions symmetrical to each other.

As shown in FIG. 1B, each of the electrodes 3a/3b, 4a/4b and 5a/5b is connected with both a direct current power supply and a ground lead through the respective switches 7a/7b, 8a/8b and 9a/9b in a way that any one of the direct current power supply and the ground lead can be selected for each of the electrodes. In addition, the direct current power supplies are connected respectively to the electrodes in a way that voltages with the different polarities are applied to any two of the neighboring electrodes. Further details of these connecting relationships are as follows. With regard to the pair of electrodes 3a/3b in the center portion 41, a positive electrode of the direct current power supply is connected to its electrode 3a on the left side, and a negative electrode of the direct current power supply is connected to its electrode 3b on the right side. With regard to the pair of electrodes 4a/4b in the annular belt-shaped region 42 adjacent to the center region 41, a negative electrode of the direct current power supply is connected to its electrode 4a on the left side, and a positive electrode of the direct current power supply is connected to its electrode 4b on the right side. With regard to the pair of electrodes 5a/5b in the outermost annular belt-shaped region 43, a positive electrode of the direct current power supply is connected to its electrode 5a on the left side, and a negative electrode of the direct current power supply is connected to its electrode 5b on the right side.

Incidentally, it should be noted that, although the pairs of electrodes 3a/3b, 4a/4b and 5a/5b are arranged in the respective regions 41, 42 and 43 in the horizontal direction when viewed from the top of the electrostatic chuck, they may be arranged therein in the vertical direction when viewed from the top of the electrostatic chuck. In such a case as well, both a direct current power supply and a ground lead are connected to each of the electrodes 3a/3b, 4a/4b and 5a/5b through the respective switches in a way that voltages with the different polarities are applied to any two of the neighboring electrodes.

Next, descriptions will be provided for a detailed structure of a wire-drawn-out part from each electrode of the electrostatic chuck 101 to a direct current power supply or the like with reference to FIG. 1C. FIG. 1C is an enlarged, cross-sectional view showing a wire-drawn-out part of the electrode 3b on the right side of the center region 41 in the electrostatic chuck 101, on behalf of all of the wire-drawn-out parts from the respective electrodes. Incidentally, convex portions in the substrate placement surface 6 are formed naturally while the main body of the electrostatic chuck is being processed. In this figure, the convex portions have been drawn in an emphatic manner.

With regard to the electrostatic chuck 101, through-holes 10a and 10b penetrating from the back surface of the base 2 to the lower surface of the electrode 3b are formed in the base 2 and the main body 1, as shown in FIG. 1C. A metal bush 11 is fitted in the through-hole 10a in the base 2. A metal 12 is embedded in the through-hole 10b from the metal bush 11 to the lower surface of the electrode 3b, which is located in the main body 1, in a way that the electrode 3b and the metal bush 11 are connected with each other through the metal 12. An insulating material 13 with a resistivity of approximately $10^{13}$ Ωcm is interposed between the embedded metal bush 11 and its surrounding base 2, and between the embedded metal bush 11 and its surrounding main body 1. A wire 14 to be connected to the power supply is drawn out from the metal bush 11.

Figure 3A:
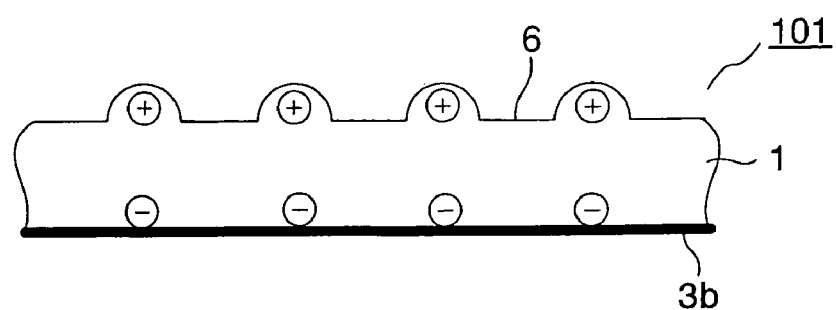
FIGS. 3A to 3B are respectively partial cross-sectional views showing the electrostatic chuck for explaining fundamentals of adsorption by the electrostatic chuck shown in FIGS. 1A and 1B.
Figure 3B:
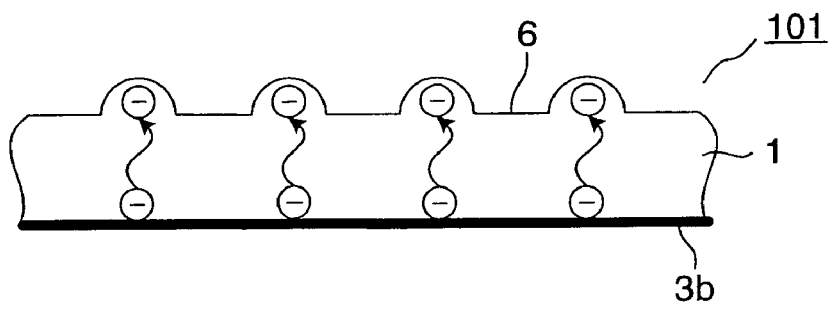

Next, descriptions will be provided for fundamentals of adsorption by the electrostatic chuck 101 shown in FIG. 1 with reference to FIGS. 3A and 3B.

There are mainly two types of causes which produce electrostatic adsorption force, that is, Coulomb adsorption force and Johnsen-Rahbek adsorption force. It is said that the difference between the causes comes from the difference in resistivity of the main body 1 to be interposed between the electrode 3b and a placed substrate. It is said that Coulomb adsorption force is produced when the resistivity of the interposed main body 1 is not smaller than $10^{13}$ Ωcm, and Johnsen-Rahbek adsorption force is produced when the resistivity of the interposed main body 1 is not larger than $10^{13}$ Ωcm.

Coulomb adsorption force is produced through the following mechanism, as shown in FIG. 3A. Voltage application causes electric charges in the electrode 3b. The electric charges induce electric charges with the reverse polarity in the surface of the main body 1 on the side for placing the substrate. The electric charges with the reverse polarity produce Coulomb adsorption force. In contrast, Johnsen-Rahbek adsorption force is produced through the following mechanism, as shown in FIG. 3B. Electric charges which have been caused in the electrode 3b move through the main body 1 having a relatively low resistance, and reach the surface of the interposed main body 1 on the side for placing the substrate. The electric charges with the same polarity, which have thus been accumulated, produce Johnsen-Rahbek adsorption force. It is said that Johnsen-Rahbek adsorption force is stronger than Coulomb adsorption force.

Any one of the two types of adsorption forces can be used for the electrostatic chuck 101 according to the present embodiment. With regard to the electrostatic chuck 101 according to the present embodiment, the resistivity of the main body 1 is in the range of $10^{10-0.15}$ Ωcm to $10^{10+0.15}$ Ωcm, and Johnsen-Rahbek adsorption force acts.

Figure 4A:
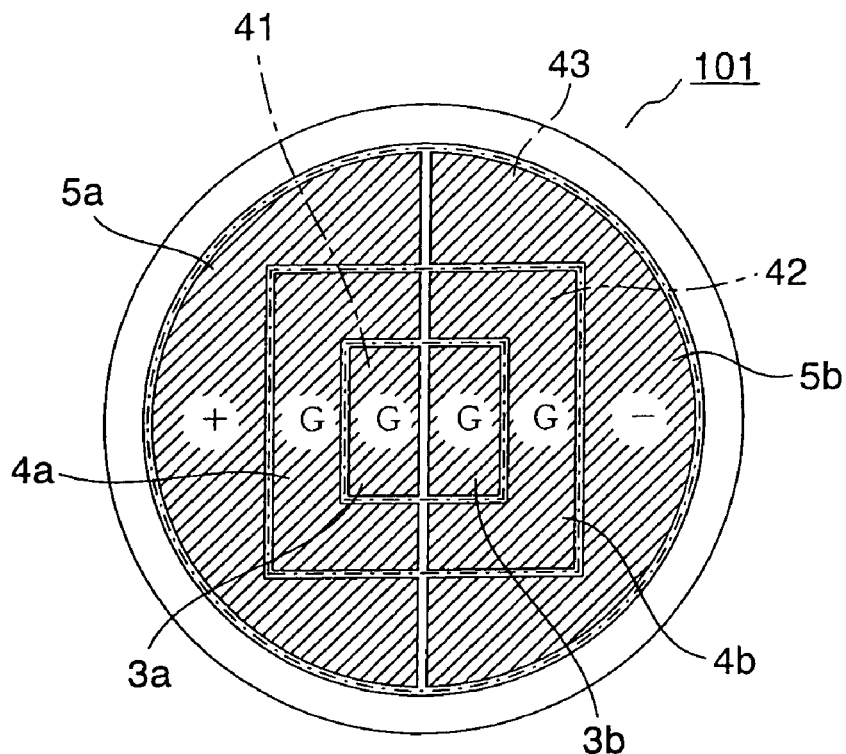
FIGS. 4A to 4F are respectively diagrams explaining how the electrostatic chuck shown in FIGS. 1A and 1B fixes a substrate.
Figure 4B:
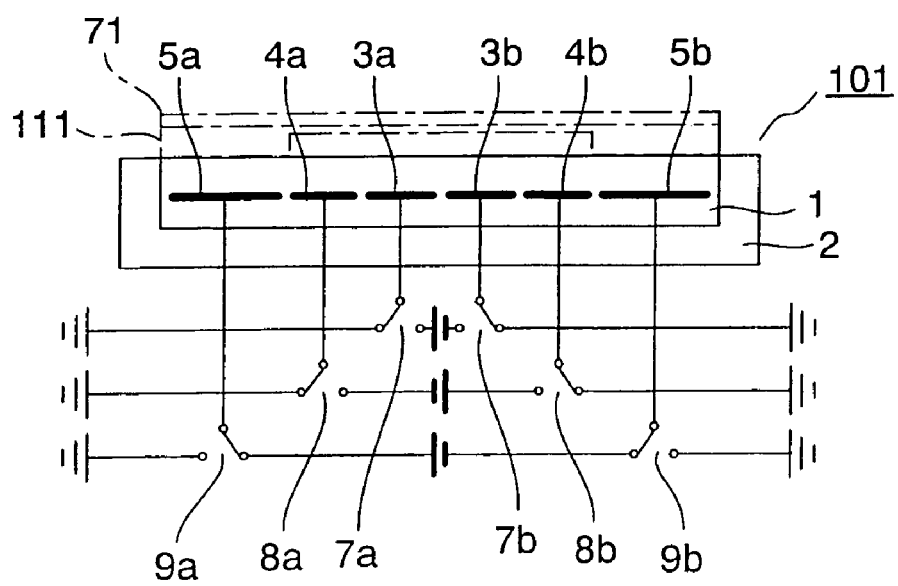
Figure 4C:
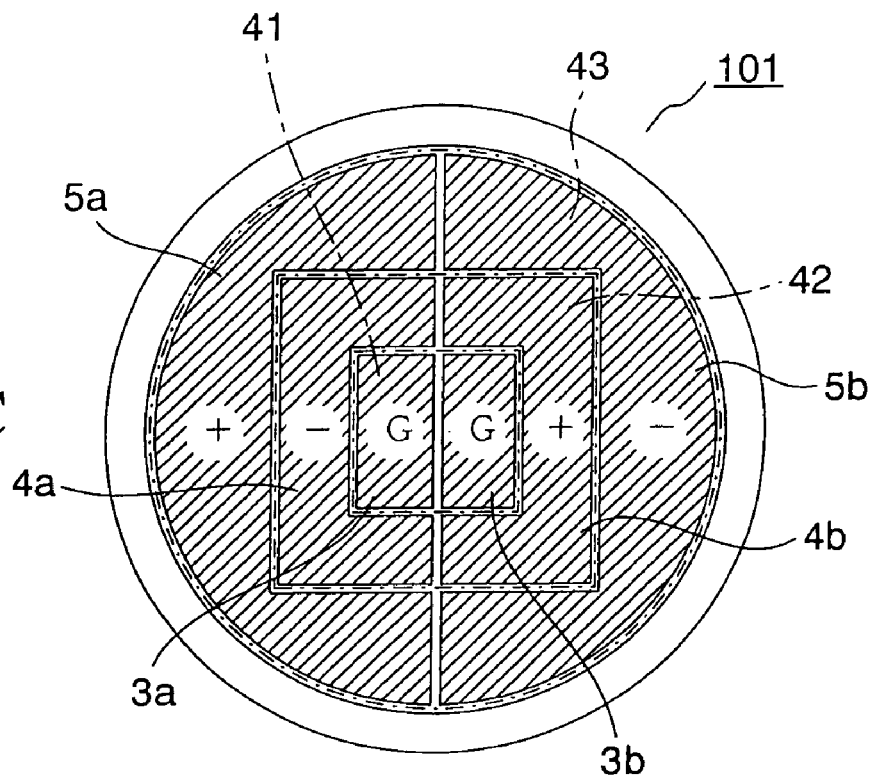
Figure 4D:
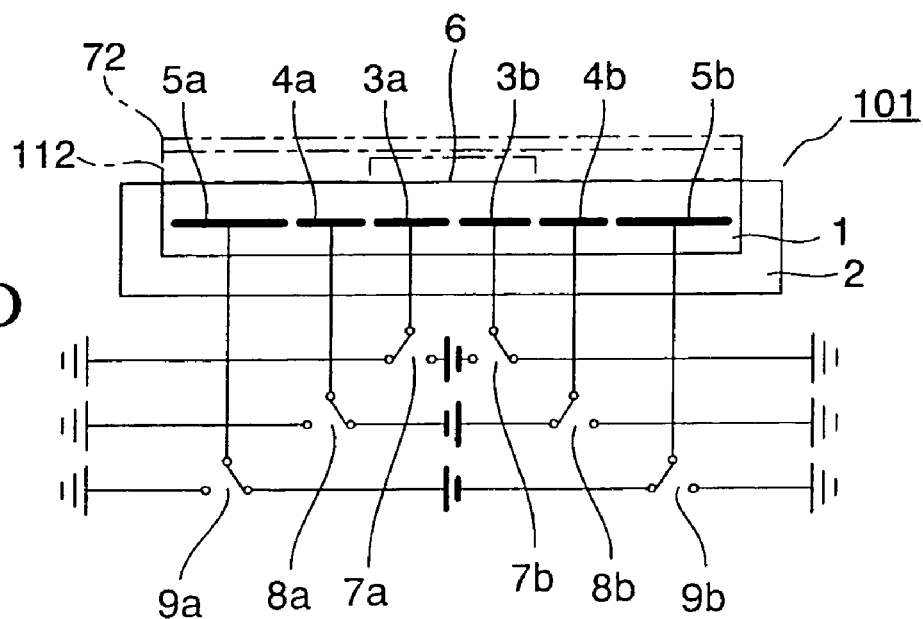
Figure 4E:
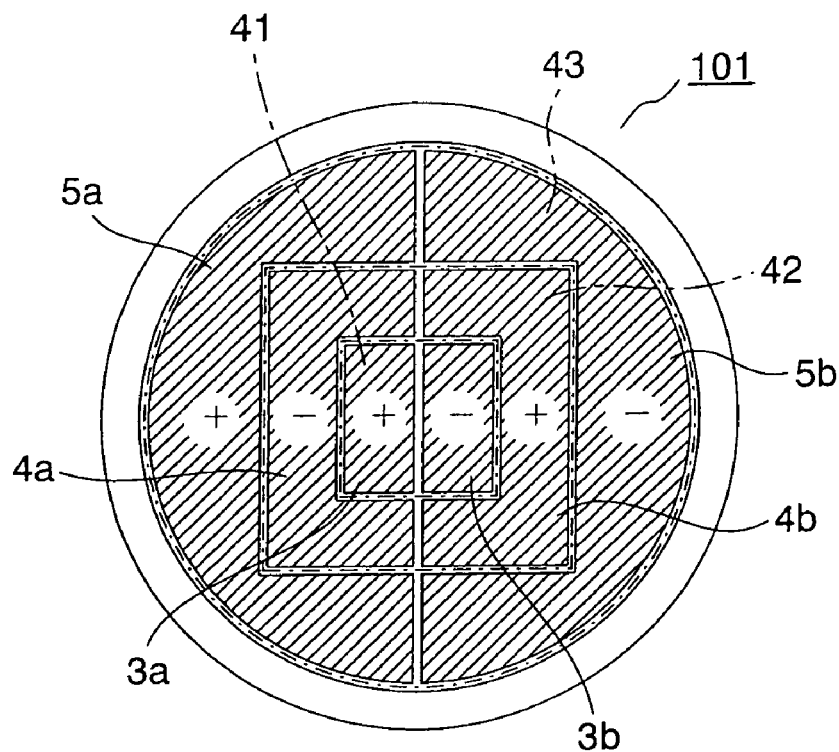
Figure 4F:
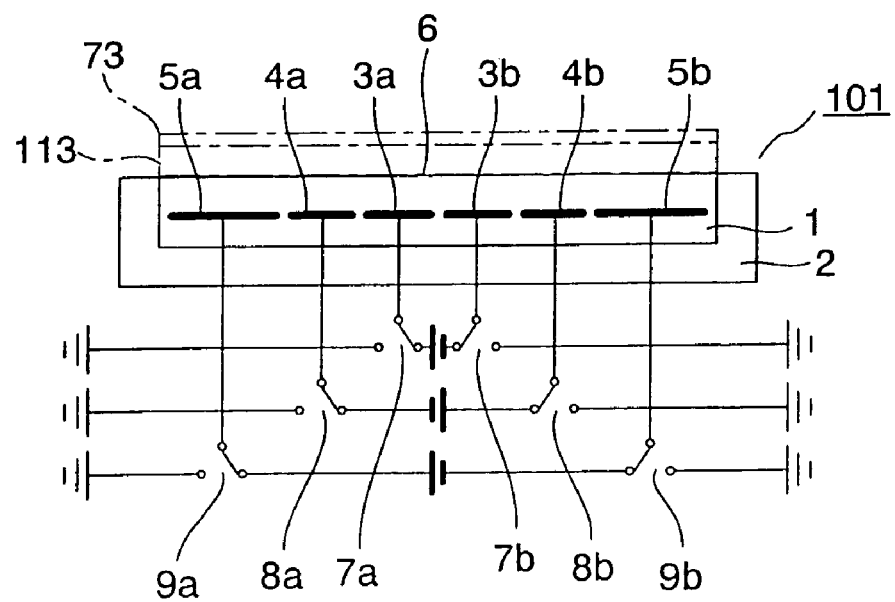

Next, descriptions will be provided for a substrate fixing method using the electrostatic chuck 101 shown in FIG. 1 with reference to FIGS. 4A to 4F. Descriptions will be provided for three cases where the respective substrates 111, 112 and 113 are placed, and hold, on the same electrostatic chuck 101, and are processed thereon. With regard to the membrane substrate 111, as shown in FIGS. 4A and 4B, its center portion is thinner than its peripheral portion, and the thinner portion is wider then that of the substrate 112. With regard to the membrane substrate 112, as shown in FIGS. 4C and 4D, its center portion is thinner than its peripheral portion, but the thinner portion is narrower then that of the substrate 111. With regard to the substrate 113, its thickness is uniform throughout the substrate, as shown in FIGS. 4E and 4F.

First of all, with regard to the membrane substrate 111 whose thinner portion is wider, the thinner portion is shaped like a quadrangle. In addition, it is assumed that the size and the planar shape of the thinner portion are almost the same as those of an aggregate region of the center region 41 including the first electrode group constituted of the electrodes 3a/3b of the electrostatic chuck 101 shown in FIG. 1 and the annular belt-shaped region 42, which is adjacent to the center region 41, including the second electrode group constituted of the electrodes 4a/4b of the electrostatic chuck 101 shown in FIG. 1. Furthermore, with regard to the membrane substrate 112 whose thinner portion is narrower, the thinner portion is shaped like a quadrangle. Moreover, the size and the planar shape of the thinner portion are almost the same as those of the center region 41 including the first electrode group constituted of the electrodes 3a/3b of the electrostatic chuck 101 shown in FIG. 1.

To begin with, in order to place, and hold, the membrane substrate 111, shown in FIGS. 4A and 4B, whose thinner portion is wider, a pair or more of electrodes to which voltage is applied are selected out of the first electrode group constituted of the electrodes 3a/3b and the second electrode group constituted of the electrodes 4a/4b and 5a/5b. It is assumed that electrodes to be selected out of the second electrode group constituted of the electrodes 4a/4b and 5a/5b are the pair of electrodes 5a/5b which is arranged in the outermost annular belt-shaped region 43.

As shown in FIG. 4B, the positive terminal and the negative terminal of the direct current power supply are connected to the pair of electrodes 5a/5b selected, by use of the switches 9a/9b. Thereafter, voltage, for example, of ±300V to ±400V is applied. Concurrently, a ground lead is connected to each of the other electrodes 3a/3b and 4a/4b. FIG. 4A shows a state where voltage is applied to each of the electrodes 3a/3b, 4a/4b and 5a/5b in this occasion. In FIG. 4A, a reference symbol+ denotes voltage with a positive polarity, and a reference symbol− denotes voltage with a negative polarity. Reference symbols G indicate that the electrodes represented by reference symbols G are grounded. Voltages with the different polarities are applied to any two of the neighboring electrodes.

If the membrane substrate 111 on which a resist film 71 is formed is placed on the electrostatic chuck 101 whose electrodes 3a/3b, 4a/4b and 5a/5b are in such voltage-applied states, the membrane substrate 111 is electrostatically adsorbed, and fixed, to the surface of the main body 1 of the electrostatic chuck. In this case, since the electrodes 3a/3b and 4a/4b below the thinner portion of the membrane substrate 111 are grounded, the electrostatic attraction does not act on the thinner portion of the membrane substrate 111. This prevents the thinner portion of the membrane substrate 111 from deflecting, thus enabling a flat exposure surface to be maintained.

Subsequently, electron beam exposure is performed on the resist film 71 placed on the membrane substrate 111. In this case, exposure can be performed on the flat exposure surface. This enables the exposure to be performed on the resist film 71 with high precision. Thereafter, the power supplies which have been connected to the electrodes 5a/5b are switched to the respective ground leads by use of the switches 9a/9b. Then, the membrane substrate 111 is removed from the electrostatic chuck, and is transferred to the outside of the processing room, which is not illustrated.

Then, in order to place, and hold, the membrane substrate 112, shown in FIGS. 4C and 4D, whose thinner portion is narrower, a pair or more of electrodes to which voltage is applied are selected out of the first electrode group constituted of the electrodes 3a/3b and the second electrode group constituted of the electrodes 4a/4b and 5a/5b. It is assumed that electrodes to be selected are all of the pairs of electrodes 4a/4b and 5a/5b which belong to the second electrode group arranged in the region surrounding the first electrode group.

As shown in FIG. 4D, positive terminals of the respective direct current power supplies are connected respectively to the electrodes 4b and 5a of the selected pairs, and negative terminals of the respective direct current power supplies are connected respectively to the electrodes 4a and 5b of the selected pairs, by use of the switches 8a/8b and 9a/9b. Thereafter, voltage, for example, of ±300V to ±400V is applied. Concurrently, the other electrodes 3a/3b are grounded. FIG. 4C shows voltages which are applied to each of the electrodes 3a/3b, 4a/4b and 5a/5b in this occasion. Voltages with the different polarities are applied to any two of the neighboring electrodes.

Subsequently, the membrane substrate 112 on which the resist film 72 is formed is transferred into the processing room. Thereafter, the membrane substrate 112 is placed on the electrostatic chuck 101 whose electrodes 3a/3b, 4a/4b and 5a/5b are in such voltage-applied states. Then, the membrane substrate 112 is electrostatically adsorbed, and fixed, to the surface of the main body 1 of the electrostatic chuck. In this case, since the electrodes 3a/3b below the thinner portion of the membrane substrate 112 are grounded, the electrostatic attraction does not act on the thinner portion of the membrane substrate 112. This prevents the thinner portion of the membrane substrate 112 from deflecting, thus enabling a flat exposure surface to be maintained.

Subsequently, exposure is performed on the resist film 72. Since the exposure can be performed on a flat exposure surface in this occasion, the exposure of the resist film 72 can be performed with high precision. Then, the power supplies which have been connected to the electrodes 4a/4b and 5a/5b are switched to the respective ground leads by use of the switches 8a/8b and 9a/9b. Then, the membrane substrate 112 on which the exposure has been performed is removed from the electrostatic chuck 101, and is transferred to the outside of the processing room.

Next, in order to place, and hold, the substrate 113, shown in FIGS. 4E and 4F, which has the same thickness throughout the substrate 113, a pair or more of electrodes to which voltage is going to be applied are selected out of the first electrode group constituted of the electrodes 3a/3b as well as the second electrode group constituted of the electrodes 4a/4b and 5a/5b. It is assumed that electrodes to be selected are all of the pair of electrodes 3a/3b which belongs to the first electrode group as well as the pairs of electrodes 4a/4b and 5a/5b which belong to the second electrode group.

Positive electrodes of the respective direct current power supplies are connected respectively to the electrodes 3a, 4b and 5a of the selected pairs, and negative electrodes of the respective direct current power supplies are connected respectively to the electrodes 3b, 4a and 5b of the selected pairs, by use of the switches 7a/7b, 8a/8b and 9a/9b. Thereafter, voltage, for example, of ±300V to ±400V is applied. In this case, adjustment of adsorption forces to the respective portions in the substrate 113 may be performed through adjustment of the applied voltages respectively by use of the direct current power supplies. FIG. 4E shows voltages which are applied respectively to the electrodes 3a/3b, 4a/4b and 5a/5b in this occasion. The potentials of the neighboring electrodes are different from each other in polarities thereof. This enables uniformity in the surface of the electrostatic adsorption force which acts on the substrate 113 to be improved, accordingly enabling the flatness of the surface of the substrate 113 to be improved.

Then, the substrate 113 on which the resist film 73 is formed is transferred to the processing room. When the substrate 113 is placed on the electrostatic chuck 101 whose electrodes 3a/3b, 4a/4b and 5a/5b are respectively in the voltage-applied states shown in FIG. 4E, the substrate 113 is electrostatically adsorbed, and fixed, to the surface of the main body 1 of the electrostatic chuck. In this occasion, the substrate 113 receives sufficiently large electrostatic attraction, which is uniform throughout the entire surface, from all of the electrodes 3a/3b, 4a/4b and 5a/5b through the substrate placement surface 6. For this reason, the substrate 113 as a whole is adsorbed to the substrate placement surface 6 firmly. This enables a flat exposure surface to be maintained.

Subsequently, exposure is performed on the resist film 73. Since the exposure can be performed on a flat exposure surface in this occasion, the exposure of the resist film 73 can be performed with high precision. Then, the power supplies which have been connected to the electrodes 3a/3b, 4a/4b and 5a/5b are switched to the respective ground leads by use of the switches 7a/7b, 8a/8b and 9a/9b. Then, the membrane substrate 113 on which the exposure has been performed is removed from the electrostatic chuck 101, and is transferred to the outside of the processing room.

As described above, according to the first embodiment of the present invention, when the membrane substrates 111 and 112 are placed, and held, on the electrostatic chuck 101, since the voltages are applied selectively in such a way that the electrostatic adsorption force will not cause deflection in the thinner portions of the respective membrane substrates 111 and 112, sufficient electrostatic adsorption force can be maintained, and concurrently the flatness of the surfaces of the respective membrane substrates 111 and 112 can be secured. In addition, when the substrate 113 with a uniform thickness is placed, and held, on the electrostatic chuck 101, voltages are applied in order to cause electrostatic adsorption force to act on the entire substrate 113, electrostatic adsorption force sufficient to hold the substrate 113 can be obtained.

Furthermore, as described above, the substrates 111, 112 and 113 with various shapes can be processed by the single electrostatic chuck 101 while the flatness of the surfaces of the respective substrates 111, 112 and 113 is being maintained, and while each of the substrates 111, 112 and 113 is being held with the corresponding sufficient electrostatic adsorption force. For this reason, electrostatic chucks 101 do not have to be changed depending on the difference in shape among the substrates 111, 112 and 113. This enables the throughput to be improved.

Second Embodiment

Figure 5A:
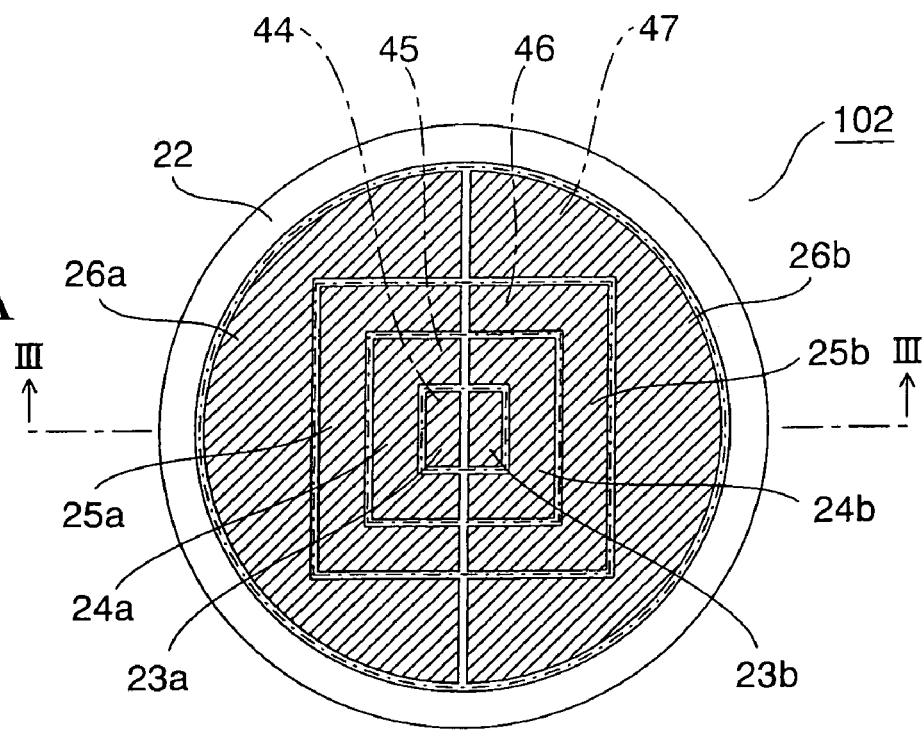
FIG. 5A is a top view showing an electrostatic chuck according to a second embodiment of the present invention.
Figure 5B:
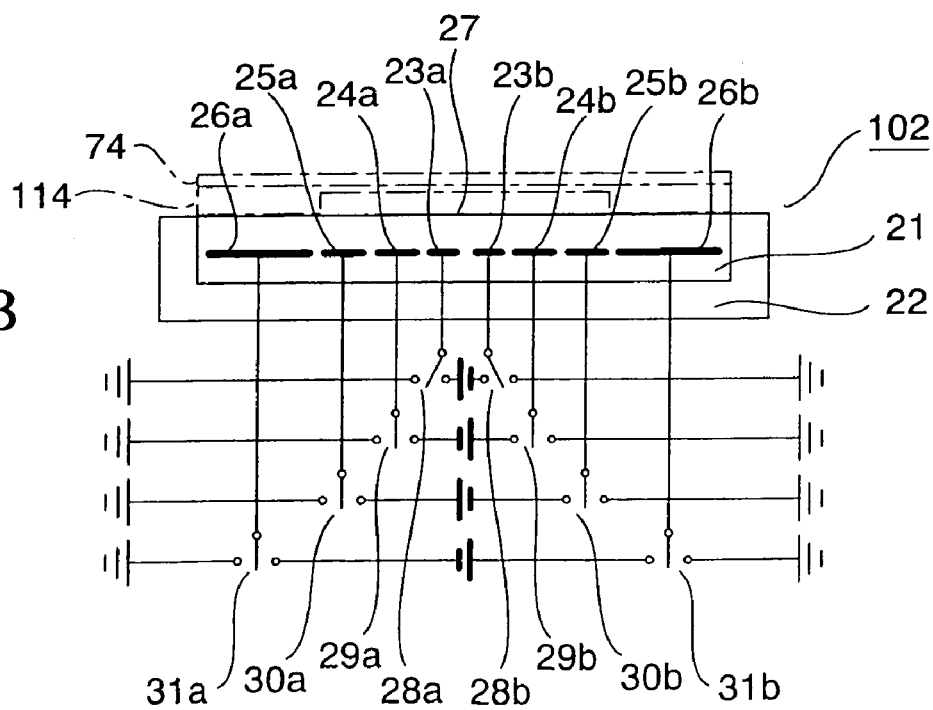
FIG. 5B is a cross-sectional view taken along the III-III line in FIG. 5A.

Next, descriptions will be provided for a second embodiment of the present invention with reference to FIGS. 5A and 5B.

FIG. 5A is a plan view of an electrostatic chuck according to the second embodiment of the present invention. FIG. 5A shows an arrangement of, in particular, 4 pairs of electrodes. FIG. 5B is a cross-sectional view taken along the III-III line in FIG. 5A. FIG. 5B also shows how direct current power supplies are connected respectively to the four pairs of electrodes. Incidentally, FIG. 5A omits an illustration of alumina members on the respective electrodes and an illustration of the substrate.

What makes the second embodiment different from the first embodiment is that the electrodes of the electrostatic chuck 102 are configured of a pair of (a first electrode group constituted of) electrodes 23a/23b which are arranged in a plane area in the center portion (center region) 44 inside the main body 21, and three pairs of (a second electrode group constituted of) electrodes 24a/24b, 25a/25b and 26a/26b, each pair of which is arranged respectively in the three annular belt-shaped regions 45, 46 and 47, the three regions of which triply surround the center region 44 while not crossing over with one another. Incidentally, in the figures, reference numeral 22 denotes a base 22 made of alumina, which covers the side surface and the lower surface of the main body 21, the base 22 having a resistivity equal to, or higher than, $10^{13}$ Ωcm, which is a higher resistivity than that of the main body 21.

In this case, with regard to the remaining configuration of the electrostatic chuck 102, the center region 44 is shaped like a quadrangle, as shown in FIG. 5A. Corresponding to this, each of the three annular belt-shaped regions 45, 46 and 47 is also shaped like an annular square. However, the outer edge of the outermost annular belt-shaped region 47 is shaped like a circle. In addition, all of the electrodes 23a/23b, 24a/24b, 25a/25b and 26a/26b are arranged in a way that they do not contact one another. In this case, the size and the planar shape of an aggregate region of the center region 44 as well as the two inner annular belt-shaped regions 45 and 46 which are close to the center region 44 are almost the same as those of a region where the membrane substrate 114 is thinner.

The pair of electrodes 23a/23b which constitute the first electrode group are arranged respectively in positions opposite to each other across the reference which is the center of the center region 44, i.e, at positions symmetrical to each other. Each of the three pairs of electrodes 24a/24b, 25a/25b and 26a/26b which constitute the second electrode group are also arranged respectively in positions opposite to each other across the reference which is the center of the center region 41, i.e, at positions symmetrical to each other.

As shown in FIG. 5B, each of the electrodes 23a/23b, 24a/24b, 25a/25b and 26a/26b is connected with both a direct current power supply and a ground lead through the respective switches 28a/28b, 29a/29b 30a/30b and 31a/31b in a way that any one of the direct current power and the ground lead can be selected for each of the electrodes depending on the difference in shape of substrates 114 to be placed, and held, on the electrostatic chuck 102. In addition, the direct current power supplies are connected respectively to the electrodes in a way that voltages with the different polarities are applied to any two of the neighboring electrodes. Further details of these connecting relationships are as follows. With regard to the pair of electrodes 23a/23b in the center portion 44, a positive terminal of the direct current power supply is connected to the electrode 23a on the left side, and a negative terminal of the direct current power supply is connected to the electrode 23b on the right side. With regard to the pair of electrodes 24a/24b in the annular belt-shaped region 45 adjacent to the center region 44, a negative terminal of the direct current power supply is connected to the electrode 24a on the left side, and a positive terminal of the direct current power supply is connected to the electrode 24b on the right side. With regard to the pair of electrodes 25a/25b in the middle annular belt-shaped region 46, a positive terminal of the direct current power supply is connected to the electrode 25a on the left side, and a negative terminal of the direct current power supply is connected to the electrode 25b on the right side. With regard to the pair of electrodes 26a/26b in the outermost annular belt-shaped region 47, a negative terminal of the direct current power supply is connected to the electrode 26a on the left side, and a positive terminal of the direct current power supply is connected to the electrode 26b on the right side.

For the electrostatic chuck 102 according to the second embodiment, also, any one of adsorption force based on the Coulomb force and Johnsen-Rahbek adsorption force can be used by adjusting the resistivity of alumina constituting the main body 21.

A substrate fixing method using the aforementioned electrostatic chuck 102 can be performed as in the case of the first embodiment.

Detailed descriptions will be omitted here. In other words, the electrodes to which voltages are going to be applied are selected depending on the difference in shape among substrates 114, the voltages can be applied only to electrodes below portions where the respective substrates 114 on which a resist film 74 is formed are thicker, and concurrently no voltages can be applied to electrodes below portions where the respective substrates 114 are thinner. This prevents deflections due to the electrostatic adsorption forces from being caused respectively in the portions where the respective substrates 114 are thinner. In addition, the substrates 114 can be firmly fixed to the electrostatic chuck 102, since the respective sufficient electrostatic adsorption forces act on the respective portions where the substrates 114 are thicker. This enables a flat exposure surface to be maintained for each of the substrates 114. Accordingly, exposure with high precision can be performed on the resist film 74 of the exposed surface.

Moreover, since the voltages with the different polarities are applied to any two of the neighboring electrodes, uniformity in the surface of electrostatic adsorption force which acts on each of the substrates 114 can be improved. This enables the flatness of the surface of each of the substrates 114 to be improved.

As described above, the electrostatic chuck 102 according to the second embodiment of the present invention has one more annular belt-shaped region than the electrostatic chuck 101 according to the first embodiment does. In other words, the electrostatic chuck 102 according to the second embodiment has annular belt-shaped regions 45, 46 and 47, which surround the center region 44, and which do not cross over with one another. In addition, an area of a sub-region where each of the electrodes 23a/23b, 24a/24b, 25a/25b and 26a/26b is arranged is smaller. For this reason, the electrostatic chuck 102 can deal with finer variations in shape of the substrates 114.

Furthermore, in comparison with the electrostatic chuck 101 according to the first embodiment, an area of each of the electrodes 23a/23b, 24a/24b, 25a/25b and 26a/26b therein is smaller, and the number of the electrodes 23a/23b, 24a/24b, 25a/25b and 26a/26b in the electrostatic chuck 102 according to the second embodiment is larger. This enables uniformity in the surface of electrostatic adsorption force which acts on each of the substrates 114 to be improved further.

In addition, as in the case of the first embodiment, when each of the membrane substrates 114 is placed, and held, on the electrostatic chuck 102, since the voltages are applied selectively in such a way that deflection due to electrostatic adsorption force is not caused in the portion where the membrane substrates 114 is thinner, sufficient electrostatic adsorption force can be maintained, and concurrently the flatness of the surface of the membrane substrate 114 can be secured. Furthermore, when a substrate with a uniform thickness is placed, and held, on the electrostatic chuck 102, since the electrostatic adsorption force acts on the entire substrate, thus electrostatic adsorption force sufficient to hold the substrate can be obtained.

Moreover, a single electrostatic chuck 102 can process the substrates 114 with various shapes while maintaining the flatness of the surfaces of the respective substrates 114, and while holding the substrates 114 with the respective sufficient electrostatic adsorption forces. For this reason, electrostatic chucks 102 do not have to be changed depending on the substrates 114 with various shapes. This enables the throughput to be improved.

Third Embodiment

Figure 6A:
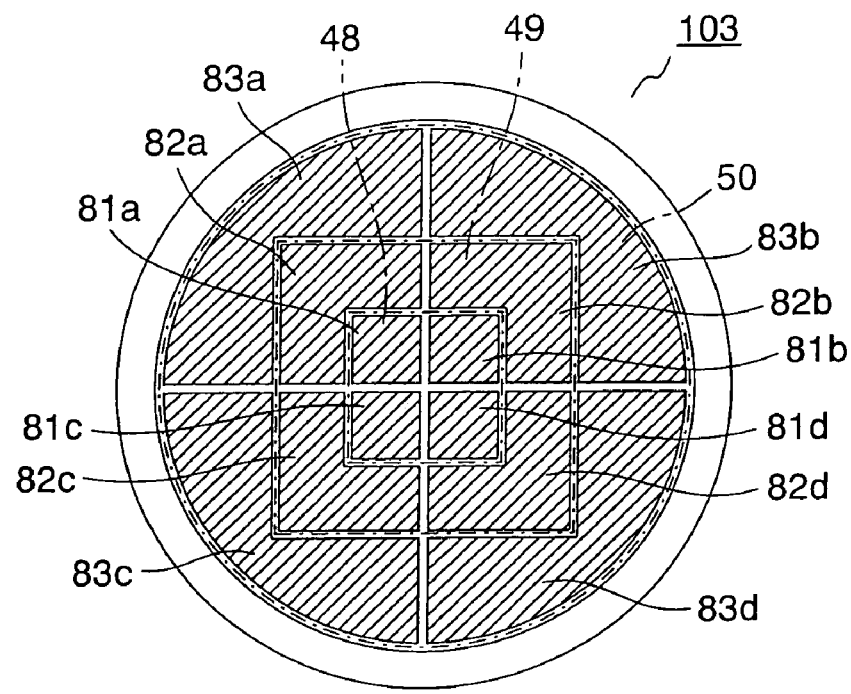
FIG. 6A is a top view showing an electrostatic chuck according to a first example of a third embodiment of the present invention.
Figure 6B:
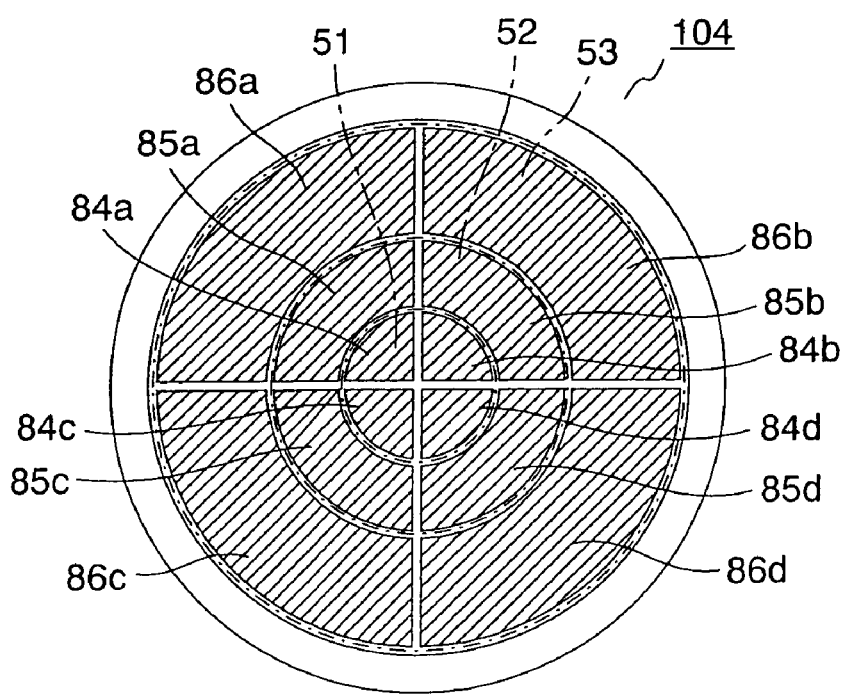
FIG. 6B is a top view showing an electrostatic chuck according to a second example of the third embodiment of the present invention.
Figure 7:
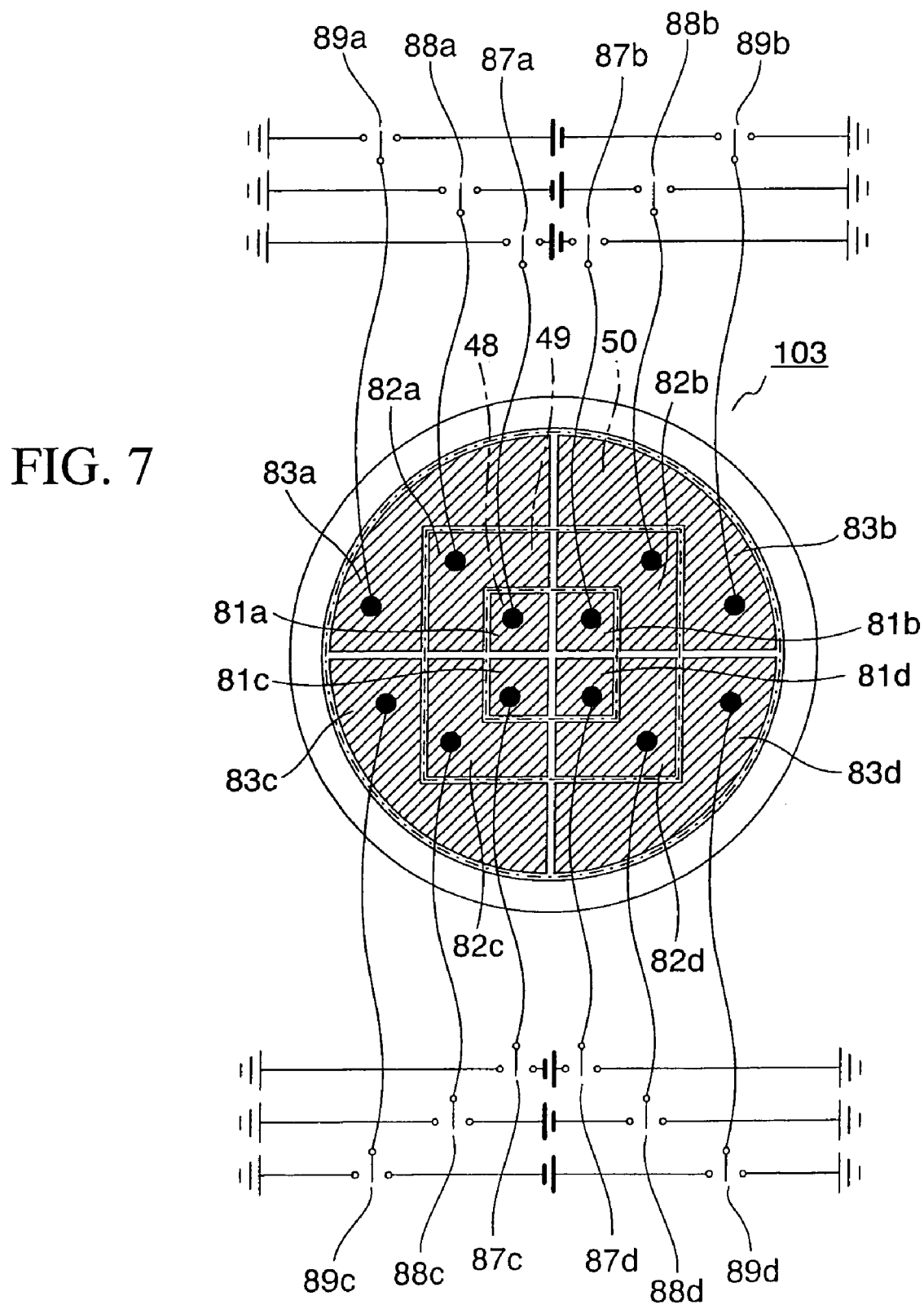
FIG. 7 is a diagram showing how direct current power supplies are connected to electrodes of the electrostatic chuck of FIG. 6A.

Next, descriptions will be provided for an electrostatic chuck according to a third embodiment of the present invention with reference to FIGS. 6 and 7.

First of all, descriptions will be provided for an electrostatic chuck according to a first example of the third embodiment with reference to FIG. 6A. FIG. 6A is a top view of the electrostatic chuck.

What makes the electrostatic chuck 103 according to the first example of the third embodiment different from the electrostatic chuck 101 shown in FIG. 1A according to the first embodiment is that, as shown in FIG. 6A, the center region 48 has two pairs of electrodes 81a/81b and 81c/81d, one annular belt-shaped region 49 has two pairs of electrodes 82*a*/82*b* and 82*c*/82*d*, and the other annular belt-shaped region 50 has two pairs of electrodes 83*a*/83*b* and 83*c*/83*d*. In other words, each of the three regions has four electrodes. In this manner, the electrostatic chuck 103 has more electrodes than the electrostatic chuck 101 does. Specifically, with regard to the electrode arrangement in FIG. 1A, the electrodes 3*a*/3*b* in the center region 41 are separately arranged respectively in the left half and the right half only, the electrodes 4*a*/4*b* in the annular belt-shaped region 42 are separately arranged respectively in the left half and the right half only, and the electrodes 5*a*/5*b* in the other annular belt-shaped region 43 are separately arranged respectively in the left half and the right half only. With regard to the electrode arrangement in FIG. 6A, the electrodes 81*a*/81*b* and 81*c*/81*d* in the center region 48 are separately arranged respectively not only in the left and right quarters but also in the upper and lower quarters, the electrodes 82*a*/82*b* and 82*c*/82*d* in the annular belt-shaped region 49 are separately arranged respectively not only in the left and right quarters but also in the upper and lower quarters, and the electrodes 83*a*/83*b* and 83*c*/83*d* in the other annular belt-shaped region 50 are separately arranged respectively not only in the left and right quarters but also in the upper and lower quarters.

Next, descriptions will be provided for an electrostatic chuck according to a second example of the third embodiment with reference to FIG. 6B. FIG. 6B is a top view of the electrostatic chuck.

What makes the electrostatic chuck 104 according to the second example of the third embodiment different from the electrostatic chuck 103 according to the first example of the third embodiment in FIG. 6A is that, as shown in FIG. 6B, the center region 51 is shaped like a circle. In this case, the two annular belt-shaped regions 52 and 53 doubly surrounding the center region 51 are respectively shaped like a circle. This also makes the electrode chuck 104 according to the second example different from the electrostatic chuck 103 according to the first example.

In addition, the electrostatic chuck 104 according to the second example of the third embodiment includes two pairs of electrodes 84*a*/84*b* and 84*c*/84*d* in the center region 51, two pairs of electrodes 85*a*/85*b* and 85*c*/85*d* in an annular belt-shaped region 52, and two pairs of electrodes 86*a*/86*b* and 86*c*/86*d* in the other annular belt-shaped region 53. In other words, the electrostatic chuck 104 includes the four electrodes in each of the three regions 51, 52 and 53.

The electrostatic chuck 104 according to the second example would be effective, in particular, if a region in a substrate where a pattern is formed would be shaped like a circle.

Next, descriptions will be provided as to how the direct current power supplies are connected to the electrodes of the electrostatic chuck shown in FIG. 6A with reference to FIG. 7. FIG. 7 is a diagram showing connection of the direct current power supplies to the respective electrodes of the electrostatic chuck in FIG. 6A. Incidentally, this explanation will be made by taking up the case of the electrostatic chuck 103 shown in FIG. 6A, which represents both cases of the electrostatic chucks shown in FIGS. 6A and 6B.

As shown in FIG. 7, four electrodes 81*a* to 81*d* are included in a center region 48, four electrodes 82*a* to 82*d* are included in an annular belt-shaped region 49, and four electrodes 83*a* to 83*d* are included in the other annular belt-shaped region 50. The electrodes 81*a* and 81*b* which are located in the upper half of the region 48 are paired with each other, the electrodes 82*a* and 82*b* which are located in the upper half of the region 49 are paired with each other, and the electrodes 83*a* and 83*b* which are located in the upper half of the region 50 are paired with each other. Each electrode in the paired electrodes 81*a*/81*b*, 82*a*/82*b* and 83*a*/83*b* is connected with both a direct current power supply and a ground lead through corresponding one of the switches 87*a*/87*b*, 88*a*/88*b* and 89*a*/89*b*. In addition, the electrodes 81*c* and 81*d* which are located in the lower half of the region 48 are paired with each other, the electrodes 82*c* and 82*d* which are located in the lower half of the region 49 are paired with each other, and the electrodes 83*c* and 83*d* which are located in the lower half of the region 50 are paired with each other. Each electrode in the paired electrodes 81*c*/81*d*, 82*c*/82*d* and 83*c*/83*d* is connected with both a direct current power supply and a ground lead through corresponding one of the switches 87*c*/87*d*, 88*c*/88*d* and 89*c*/89*d*. In addition, the direct current power supplies are connected respectively to the electrodes in a way that voltages with the different polarities are applied to any two of the neighboring electrodes. Further detailed descriptions of these connecting relationships will be provided below. The connections concerning the three pairs of electrodes 81*a*/81*b*, 82*a*/82*b* and 83*a*/83*b* which are located respectively in the upper halves of the regions 48, 49 and 50 are as follows. With regard to the pair of electrodes 81*a*/81*b* in the center region 48, a positive terminal of the direct current power supply is connected to the electrode 81*a* on the left side, and a negative terminal of the direct current power supply is connected to the electrode 81*b* on the right side. With regard to the pair of electrodes 82*a*/82*b* in the annular belt-shaped region 49 adjacent to the center region 48, a negative terminal of the direct current power supply is connected to the electrode 82*a* on the left side, and a positive terminal of the direct current power supply is connected to the electrode 82*b* on the right side. With regard to the pair of electrodes 83*a*/83*b* in the outermost annular belt-shaped region 50, a positive terminal of the direct current power supply is connected to the electrode 83*a* on the left side, and a negative terminal of the direct current power supply is connected to the electrode 83*b* on the right side. The three pairs of electrodes 81*c*/81*d*, 82*c*/82*d* and 83*c*/83*d* which are located respectively in the lower halves of the regions are connected to the respective direct current power supplies in a manner reverse to the aforementioned one.

It should be noted that, in the aforementioned case, the electrodes 81*a* and 81*b* which are located in the upper half of the region 48 are paired with each other, the electrodes 82*a* and 82*b* which are located in the upper half of the region 49 are paired with each other, and the electrodes 83*a* and 83*b* which are located in the upper half of the region 50 are paired with each other. In addition, the electrodes 81*c* and 81*d* which are located in the lower half of the region 48 are paired with each other, the electrodes 82*c* and 82*d* which are located in the lower half of the region 49 are paired with each other, and the electrodes 83*c* and 83*d* which are located in the lower half of the region 50 are paired with each other. However, the electrodes 81*a* and 81*c* which are located in the left half of the region 48 may be paired with each other, the electrodes 82*a* and 82*c* which are located in the left half of the region 49 may be paired with each other, and the electrodes 83*a* and 83*c* which are located in the left half of the region 50 may be paired with each other. In addition, the electrodes 81*b* and 81*d* which are located in the right half of the region 48 may be paired with each other, the electrodes 82*b* and 82*d* which are located in the right half of the region 49 may be paired with each other, and the electrodes 83*b* and 83*d* which are located in the right half of the region 50 may be paired with each other. In this case as well, each electrode in the paired electrodes 81*a*/81*c*, 82*a*/82*c*, 83*a*/83*c*, 81*b*/81*d*, 82*b*/82*d* and 83*b*/83*d* can be connected with both a direct current power supply and a ground lead through corresponding one of the switches which are not illustrated, in a way such that voltages with different polarities are applied respectively to any two of neighboring electrodes.

As described above, the electrostatic chucks 103 and 104 according to the third embodiment of the present invention can bring about the same effects as the electrostatic chucks 101 and 102 respectively according to the first and the second embodiments. In addition, in comparison with the electrostatic chuck 101 according to the first embodiment, an area of each of the electrodes in the electrostatic chucks 103 and 104 is smaller, and the number of the electrodes therein is larger. For these reasons, the electrostatic chucks 103 and 104 can deal with finer variation in shape of substrates.

Moreover, in comparison with the electrostatic chuck 101 according to the first embodiment, an area of each of the electrodes 81b/81d, 82b/82d, 83b/83d in the electrostatic chucks 103 and 104 according to the third embodiment is smaller, and the number of the electrodes 81b/81d, 82b/82d and 83b/83d therein is larger. For these reasons, uniformity in the surface of the electrostatic adsorption force which acts on the substrate can be improved further.

Detailed descriptions have been provided for the present invention with reference to the embodiments. However, the scope of the present invention should not be limited to the specific examples which have been given for the aforementioned embodiments. Modifications of the aforementioned embodiments without departing from the scope and spirit of the present invention should be included in the scope of the present invention.

According to the aforementioned embodiments, the electrostatic chucks are applied, for example, to the electron beam exposure apparatus in particular. However, the electrostatic chucks according to the present invention can be applied to low pressure processing apparatus, such as charged particle beam exposure apparatus of other types, deposition apparatus using low pressure CVD or sputtering, etching apparatus, which perform a process in a low pressure. In addition, the electrostatic chucks according to the present invention can be applied to substrate transferring apparatus which are operated in a low pressure.

Furthermore, according to the aforementioned embodiments, the electrostatic chucks are applied to substrates of which exposure masks are formed. However, the electrostatic chucks according to the present invention can be applied to substrates of which semiconductor devices are fabricated, and in which wiring patterns and contact holes of insulating films are formed. Additionally, the electrostatic chucks according to the present invention can be applied to substrates of which micro machines are fabricated.

Moreover, arrangements of electrodes are not limited to the aforementioned embodiments. As long as a single electrostatic chuck can maintain flatness of the surface of each of substrates respectively with various shapes, and as long as the single electrostatic chuck can obtain sufficient adsorption force for each of the substrate, no matter what arrangement of electrodes may be applied.

As described above, each of the electrostatic chucks according to the present invention includes the first electrode group constituted of one pair or more of electrodes which are arranged in the center region within the main body as well as the second electrode group constituted of one pair or more of electrodes which are arranged in the peripheral portion surrounding the center region.

In addition, with regard to the substrate fixing method using each of the electrostatic chucks according to the present invention, one pair or more of electrodes to which voltages are going to be applied are selected out of the first electrode group and the second electrode group, and voltages are applied respectively to electrodes in the selected pair(s). Thereby, the substrate is electrostatically adsorbed to the surface of the main body of each of the electrostatic chucks.

Accordingly, when a membrane substrate is placed, and held, on each of the electrostatic chucks according to the present invention, since the voltages are applied selectively in such a way that deflections due to electrostatic adsorption force is not caused in the portion where the membrane substrate is thinner, sufficient electrostatic force can be maintained, and concurrently flatness of the surface of the membrane substrate can be secured. In addition, when a substrate with a uniform thickness is placed, and held, on each of the electrostatic chucks according to the present invention, since the electrostatic adsorption force acts on the entire substrate, electrostatic adsorption force sufficient to hold the substrate can be obtained.

Moreover, according to the present invention, a single electrostatic chuck can process substrates with various shapes while maintaining flatness of the surface of each of the substrates, and while holding each of the substrates with sufficient electrostatic force. For this reason, electrostatic chucks do not have to be changed depending on the difference in shape among substrates. Accordingly, the throughput can be improved.

What is claimed is:

1. An electrostatic chuck, comprising:
   a main body where a substrate is placed and held on a surface thereof;
   a first electrode group including one pair or more of electrodes arranged in a center region of the main body, the electrodes being electrically insulated from one another by the main body; and
   a second electrode group including one pair or more of electrodes arranged in an outer peripheral portion surrounding the center region, the electrodes being electrically insulated from one another by the main body;
   wherein the main body is integrally formed and the pairs of electrodes in the first and second electrode groups are embedded in the main body;
   wherein one or more pairs of the first electrode group receive a first voltage in a case where a substrate to be fixed by the electrostatic chuck has same thickness throughout; and
   wherein one or more pairs of the second electrode group receive a second voltage in a case where a substrate to be fixed by the electrostatic chuck has thickness that is thinner at its center portion than that at its peripheral portion where an amount of the second voltage corresponds to the peripheral portion.

2. The electrostatic chuck according to claim 1, wherein the second electrode group is any one of a group configured of one pair or more of electrodes arranged in one annular belt-shaped region surrounding the center region and a group of one pair or more of electrodes arranged respectively in two or more annular belt-shaped regions which multiply surround the center region.

3. The electrostatic chuck according to claim 1, wherein any paired electrodes in a plurality of electrodes included in the first electrode group are arranged respectively in positions corresponding to each other across a reference which defines a center of the center region, and any paired electrodes in a plurality of electrodes included in the second electrode group are arranged respectively in positions corresponding to each other across the reference.

4. The electrostatic chuck according to claim 1, wherein each of the first electrode group and the second electrode group includes a pair of electrodes.

5. The electrostatic chuck according to claim 1, wherein both a direct current power supply and a ground lead are connected to each electrode in each of the pairs of electrodes in a way that any one of the direct current power supply and the ground lead can be selected; and wherein the direct current power supply is connected to the electrode in a way that voltages with different polarities are applied respectively to any two of neighboring electrodes.

6. The electrostatic chuck according to claim 1, wherein the center region is shaped like any one of a circle and a quadrangle.

7. A substrate fixing method using an electrostatic chuck comprising the steps of:
selecting one pair or more of electrodes to which voltages are going to be applied out of a first electrode group including one pair or more of electrodes arranged in a center region inside a main body of the electrostatic chuck where the main body is integrally formed;
selecting one pair or more of electrodes to which voltages are going to be applied out of a second electrode group including one pair or more of electrodes arranged in an outer peripheral portion surrounding the center region where the pairs of electrodes in the first and second electrode groups are embedded in the main body and electrically insulated from one another by the main body; and
applying voltage to each electrode of each of the selected pairs of electrodes, and thereby making a substrate to electrostatically adsorb to a surface of the main body of the electrostatic chuck;
wherein the electrodes other than the selected one or more pairs to which the voltages are going to be applied are grounded;
wherein one or more pairs of the first electrode group receive a first voltage in a case where a substrate to be fixed by the electrostatic chuck has same thickness throughout; and
wherein one or more pairs of the second electrode group receive a second voltage in a case where a substrate to be fixed by the electrostatic chuck has thickness that is thinner at its center portion than that at its peripheral portion where an amount of the second voltage corresponds to the peripheral portion.

8. The substrate fixing method using the electrostatic chuck according to claim 7, wherein the second electrode group is any one of a group configured of one pair or more of electrodes arranged in one annular belt-shaped region surrounding the center region and a group of one pair or more of electrodes arranged respectively in two or more annular belt-shaped regions which multiply surround the center region.

9. The substrate fixing method using the electrostatic chuck according to claim 7, wherein the substrate is a substrate for an electron beam exposure mask.

10. The substrate fixing method using the electrostatic chuck according to claim 7, wherein voltages are applied respectively to the electrodes in each of the selected pairs in a way that any two of the neighboring electrodes have different polarities.

* * * * *